(12) United States Patent
Wu (10) Patent No.: US 6,329,251 B1
(45) Date of Patent: Dec. 11, 2001

(54) MICROELECTRONIC FABRICATION METHOD EMPLOYING SELF-ALIGNED SELECTIVELY DEPOSITED SILICON LAYER (75) Inventor: Cheng-Ming Wu, Kaohsiung (TW)

(73) Assignee: Taiwan Semiconductor Manufacturing Company, Ltd, Hsin Chu (TW)

(*) Notice: Subject to any disclaimer, the term of this patent is extended or adjusted under 35 U.S.C. 154(b) by 0 days.

(21) Appl. No.: 09/636,561

(22) Filed: Aug. 10, 2000

(51) Int. Cl.⁷ .................. H01L 21/8234; H01L 21/336; H01L 21/76; H01L 21/22
(52) U.S. Cl. ............... 438/275; 438/300; 438/427; 438/548; 438/558; 438/585
(58) Field of Search ..................... 438/585–589, 438/514–516, 537, 541, 542, 275, 547, 548, 557, 558, 300, 427

(56) References Cited

U.S. PATENT DOCUMENTS

| 4,966,868 | 10/1990 | Murali et al. ............... 438/232 |
| 5,736,419 | * 4/1998 | Naem ........................ 438/300 |
| 5,854,127 | 12/1998 | Pan .......................... 438/629 |
| 5,879,994 | * 3/1999 | Kwan et al. ................ 438/268 |
| 5,956,615 | 9/1999 | Nguyen ...................... 438/657 |
| 6,037,211 | 3/2000 | Jeng et al. ................. 438/253 |

* cited by examiner

Primary Examiner—Ha Tran Nguyen
(74) Attorney, Agent, or Firm—Tung & Associates

(57) ABSTRACT

Within a method for fabricating a microelectronic device there is first provided a silicon substrate. There is then formed upon the silicon substrate a first series of structures having a comparatively narrow spacing which leaves exposed a first series of comparatively narrow portions of the silicon substrate, and where the first series of structures is separated from a second series of structures also formed upon the silicon substrate, the second series of structures having a comparatively wide spacing which leaves exposed a second series of comparatively wide portions of the silicon substrate. There is then masked one of the first series of comparatively narrow portions of the silicon substrate and the second series of comparatively wide portions of the silicon substrate. There is then formed selectively upon the other of the first series of comparatively narrow portions of the silicon substrate and the second series of comparatively wide portions of the silicon substrate a series of patterned silicon layers. Finally, there is then doped simultaneously the series of patterned silicon layers and the one of the first series of comparatively narrow portions of the silicon substrate and the second series of comparatively wide portions of the silicon substrate which was masked.

15 Claims, 3 Drawing Sheets

MICROELECTRONIC FABRICATION METHOD EMPLOYING SELF-ALIGNED SELECTIVELY DEPOSITED SILICON LAYER

BACKGROUND OF THE INVENTION

1. Field of the Invention

The present invention relates generally to methods for fabricating microelectronic fabrications. More particularly, the present invention relates to self-aligned methods for fabricating microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly common within the art of microelectronic fabrication to employ self-aligned methods to form self-aligned microelectronic structures within microelectronic fabrications. Self-aligned methods for forming self-aligned microelectronic structures within microelectronic fabrications are common and desirable in the art of microelectronic fabrication insofar as self-aligned methods for forming self-aligned microelectronic structures within microelectronic fabrications by their nature avoid when forming the self-aligned microelectronic structures within the microelectronic fabrications the use of photolithographic methods. In turn, it is clearly also desirable to avoid when fabricating microelectronic structures within microelectronic fabrication the use of photolithographic methods insofar as photolithographic methods provide photolithographic misregistration tolerances when forming microelectronic structures within the microelectronic fabrications.

While self-aligned methods are thus clearly desirable within the art of microelectronic fabrication for forming self-aligned microelectronic structures within microelectronic fabrications, self-aligned methods are nonetheless not entirely without problems in the art of microelectronic fabrication for forming self-aligned microelectronic structures within microelectronic fabrications.

In that regard, self-aligned methods, while desirable insofar as they avoid photolithographic misregistration tolerances when fabricating self-aligned microelectronic structures within microelectronic fabrications, nonetheless typically suffer from problems such as but not limited to over-etching problems, in particular under circumstances where, for example, a self-aligned method is employed for forming a high aspect ratio self-aligned via interposed between a pair of high aspect ratio microelectronic structures within a microelectronic fabrication. In particular, such problematic over-etching may be needed to completely clear the surface of a conductor layer which is accessed by the high aspect ratio self-aligned via. Similarly, such over-etching may provide for reliability problems with respect to electrical performance of a conductor stud layer which is subsequently formed into the high aspect ratio self-aligned via within the microelectronic fabrication.

It is thus desirable in the art of microelectronic fabrication to provide self-aligned methods through which may be formed with enhanced reliability self-aligned microelectronic structures within microelectronic fabrications.

It is towards the foregoing object that the present invention is directed.

Various self-aligned methods have been disclosed in the art of microelectronic fabrication for forming various self-aligned microelectronic structures with desirable properties within microelectronic fabrications.

For example, Murali et al., in U.S. Pat. No. 4,966,868, discloses a self-aligned method for forming, with enhanced junction integrity, a self-aligned conductor contact stud filling a contact via which accesses a silicon semiconductor substrate within a semiconductor integrated circuit microelectronic fabrication. To realize the foregoing object, the self-aligned method employs forming within the contact via the self-aligned conductor contact stud formed at least in part of a polysilicon material formed employing a selective deposition method.

In addition, Pan, in U.S. Pat. No. 5,854,127, discloses a self-aligned method for forming within a microelectronic fabrication a landing pad layer in contact with a polysilicon conductor contact stud, wherein the landing pad layer is formed of areal dimensions greater than the polysilicon conductor contact stud. To realize the foregoing object, the self-aligned method employs in a first instance the polysilicon conductor contact stud formed interposed between a pair of microelectronic structures within the microelectronic fabrication, wherein upon thermal annealing of a metal silicide forming metal layer formed upon the polysilicon conductor contact stud and spanning to the pair of microelectronic structures within the microelectronic fabrication there is formed a metal. silicide landing pad layer of areal dimensions greater than the polysilicon conductor contact stud.

Further, Nguyen et al., in U.S. Pat. No. 5,956,615, discloses an in-part self-aligned method for forming within a microelectronic fabrication a landing pad layer in contact with a conductor stud in such a manner as to reduce an aspect ratio of an interconnection via subsequently formed through a dielectric layer which passivates the landing pad layer in contact with the conductor stud. To realize the foregoing object, the in-part self-aligned method preferably employs when forming both the conductor stud and the landing pad layer a doped polysilicon material formed as a single layer.

Finally, Jeng et al., in U.S. Pat. No. 6,037,211, discloses a self-aligned method for forming within a semiconductor integrated circuit microelectronic fabrication a conductor contact stud in a fashion such as to provide for enhanced contact area of the conductor contact stud when forming an additional conductor layer in contact with the conductor contact stud. To realize the foregoing object, the method employs when forming the conductor contact stud while employing the self-aligned method a mask layer having formed at its periphery an annular conductor layer which supplements the conductor contact stud at its upper periphery such as to provide the conductor contact stud with enhanced contact area.

Desirable in the art of microelectronic fabrication are additional self-aligned methods which may be employed for forming, with enhanced reliability, self-aligned microelectronic structures within microelectronic fabrications.

It is towards the foregoing object that the present invention is directed.

SUMMARY OF THE INVENTION

A first object of the present invention is to provide a self-aligned method for forming a self-aligned microelectronic structure within a microelectronic fabrication.

A second object of the present invention is to provide a method in accord with the first object of the present invention, wherein the self-aligned microelectronic structure is formed with enhanced reliability.

A third object of the present invention is to provide a method in accord with the first object of the present invention and the second object of the present invention, which method is readily commercially implemented.

In accord with the objects of the present invention, there is provided by the present invention a method for fabricating a microelectronic fabrication. To practice the method of the present invention, there is first provided a silicon substrate. There is then formed upon the silicon substrate a first series of structures having a comparatively narrow spacing which leaves exposed a first series of comparatively narrow portions of the silicon substrate, and where the first series of structures is separated from a second series of structures also formed upon the silicon substrate, the second series of structures having a comparatively wide spacing which leaves exposed a second series of comparatively wide portions of the silicon substrate. There is then masked one of the first series of comparatively narrow portions of the silicon substrate and the second series of comparatively wide portions of the silicon substrate. There is then formed selectively upon the other of the first series of comparatively narrow portions of the silicon substrate and the second series of comparatively wide portions of the silicon substrate a series of patterned silicon layers. There is then doped simultaneously the series of patterned silicon layers and the one of the first series of comparatively narrow portions of the silicon substrate and the second series of comparatively wide portions of the silicon substrate which was masked.

There is provided by the present invention a self-aligned method for forming with enhanced reliability a self-aligned microelectronic structure within a microelectronic fabrication. The present invention realizes the foregoing object by employing a masking of one of: (1) a first series of comparatively narrow portions of a silicon substrate defined by a first series of structures formed upon the silicon substrate; and (2) a second series of comparatively wide portions of the silicon substrate defined by a second series of structures formed upon the silicon substrate, such as to allow for selective deposition of a series of patterned silicon layers upon the unmasked portions of the silicon substrate, followed by doping simultaneously the patterned silicon layers and the one of the comparatively narrow portions of the silicon substrate and the comparatively wide portion of the silicon substrate which was masked.

The method of the present invention is readily commercially implemented. The present invention employs methods and materials as are generally known in the art of microelectronic fabrication, but employed within the context of a specific ordering and process control to provide the present invention. Since it is thus a specific ordering and process control within the present invention which at least in part provides the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

There is provided by the present invention a self-aligned method for forming with enhanced reliability a self-aligned microelectronic structure within a microelectronic fabrication. The present invention realizes the foregoing object by employing a masking of one of: (1) a first series of comparatively narrow portions of a silicon substrate defined by a first series of structures formed upon the silicon substrate; and (2) a second series of comparatively wide portions of the silicon substrate defined by a second series of structures formed upon the silicon substrate, such as to allow for selective deposition of a series of patterned silicon layers upon the unmasked portions of the silicon substrate, followed by doping simultaneously the patterned silicon layers and the one of the comparatively narrow portions of the silicon substrate and the comparatively wide portion of the silicon substrate which was masked.

First Preferred Embodiment

Figure 1:
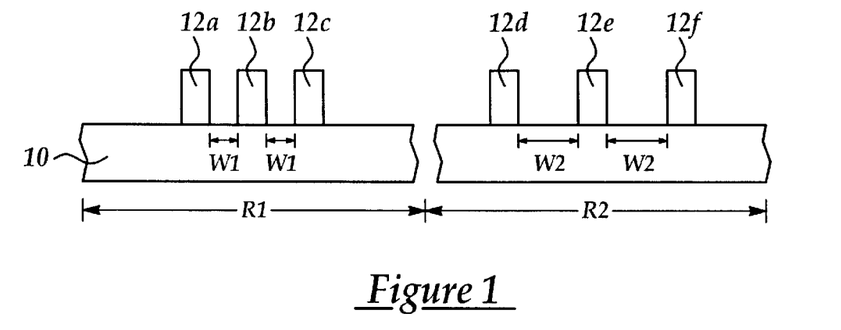
FIG. 1 to FIG. 3 show a series of schematic cross-sectional diagrams illustrating the results of forming, in accord with a general embodiment of the present invention which comprises a first preferred embodiment of the present invention, a plurality of series of self-aligned microelectronic structures within a microelectronic fabrication.
Figure 2:
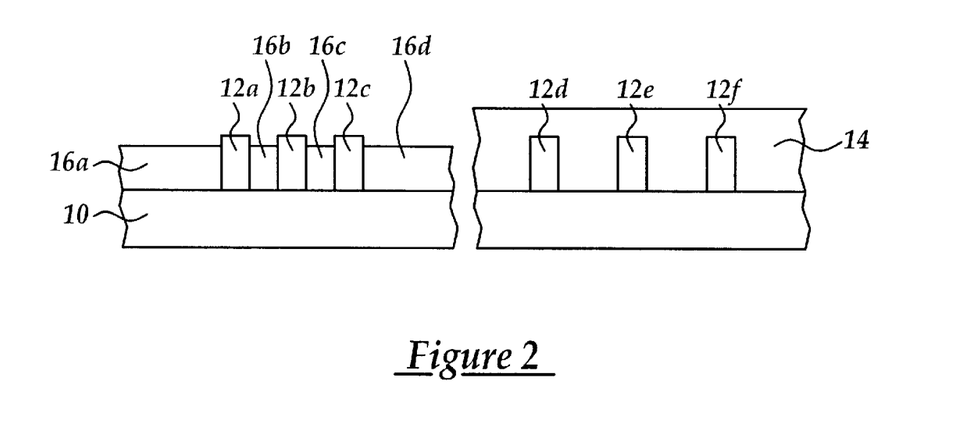
Figure 3:
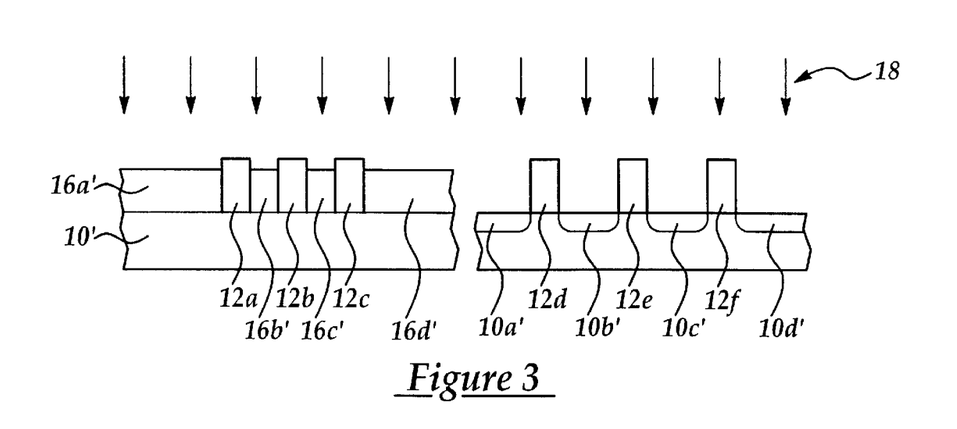

Referring now to FIG. 1 to FIG. 3, there is shown a series of schematic cross-sectional diagrams illustrating the results of forming, in accord with a general embodiment of the present invention which comprises a first preferred embodiment of the present invention, a plurality of series of self-aligned microelectronic structures within a microelectronic fabrication.

Shown in FIG. 1 is a schematic cross-sectional diagram of the microelectronic fabrication at an early stage in its fabrication in accord with the first preferred embodiment of the present invention.

Shown in FIG. 1 is a silicon substrate 10 having formed upon its surface a series of patterned microelectronic structures 12a, 12b, 12c, 12d, 12e and 12f.

Within the first preferred embodiment of the present invention with respect to the silicon substrate 10, the silicon substrate 10 may be formed from silicon materials as are known in the art of microelectronic fabrication, including but not limited to amorphous silicon materials, monocrystalline silicon materials and polycrystalline silicon materials. More typically and preferably, the silicon substrate 10 is formed from a silicon material selected from the group consisting of monocrystalline silicon materials and polycrystalline silicon materials.

As is understood by a person skilled in the art, although the first preferred embodiment of the present invention illustrates the present invention within the context of the silicon substrate 10 as a single layer silicon substrate, in a more general sense, the first preferred embodiment of the present invention requires only that a top layer of a substrate, such as the silicon substrate 10, is formed of a silicon material selected from the foregoing group of silicon materials. Typically and preferably, the top layer of the substrate which is formed of the silicon material will be formed to a thickness of from about 10,000 to about 50,000 angstroms. The remainder of the substrate other than the top layer which is formed of a silicon material may be formed of a laminate of microelectronic layers formed of microelectronic materials selected from the group including but not limited to microelectronic conductor materials, microelectronic semiconductor materials and microelectronic dielectric materials.

As is similarly also understood by a person skilled in the art, the silicon substrate 10 as illustrated within the schematic cross-sectional diagram of FIG. 1, or in the alternative some other substrate having formed as its top layer a silicon layer, may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Within the first preferred embodiment of the present invention with respect to the series of patterned microelectronic structures 12a, 12b, 12c, 12d, 12e and 12f, the series of patterned microelectronic structures 12a, 12b, 12c, 12d, 12e and 12f may also be formed of microelectronic materials selected from the group consisting of microelectronic conductor materials, microelectronic semiconductor materials and microelectronic dielectric materials, as well as laminates thereof. Typically and preferably, although not exclusively, the series of patterned microelectronic structures 12a, 12b, 12c, 12d, 12e and 12f is formed, at least at its outer surfaces, of a microelectronic dielectric material. Similarly, typically and preferably, each of the series of patterned microelectronic structures 12a, 12b, 12c, 12d, 12e and 12f is formed to a thickness of from about 2,000 angstroms to about 6,000 angstroms.

As is finally illustrated within the schematic cross-sectional diagram of FIG. 1, the series of patterned microelectronic structures 12a, 12b and 12c is formed upon a first region R1 of the silicon substrate 10 to form a first series of patterned microelectronic structures having a comparatively narrow spacing W1 which leaves exposed a first series of comparatively narrow portions of the silicon substrate 10. Similarly, the series of patterned microelectronic structures 12d, 12e and 12f is formed upon a second region R2 of the silicon substrate 10 to form a second series of patterned microelectronic structures having a comparatively wide spacing W2 which leaves exposed a second series of comparatively wide portions of the silicon substrate 10. Within the first preferred embodiment of the present invention, the comparatively narrow spacing W1 is typically and preferably from about 0.1 to about 0.5 microns, while the comparatively wide spacing W2 is typically and preferably from about 0.1 to about 0.5 microns.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein, in a first instance, there is formed a patterned masking layer 14 covering the second region R2 of the silicon substrate 10 including the second series of microelectronic structures 12d, 12e and 12f. Within the first preferred embodiment of the present invention, although the patterned masking layer 14 may be formed from any of several masking materials as are conventional in the art of microelectronic fabrication, including but not limited to photoresist masking materials and hard masking materials, from a practical perspective, and for reasons which follow, the patterned masking layer 14 is typically and preferably formed of a hard masking material which has limited susceptibility to thermal degradation. Typically and preferably, the patterned masking layer 14 is formed to a thickness of from about 3,000 to about 8,500 angstroms, and may be conformal rather than planar, as illustrated within the schematic cross-sectional diagram of FIG. 2. Important to the present invention is that the patterned masking layer 14 masks the comparatively wide portions of the silicon substrate 10 within the second region R2 of the silicon substrate 10.

Shown also within the schematic cross-sectional diagram of FIG. 2 is a series of patterned silicon layers 16a, 16b, 16c and 16d which is formed upon exposed portions of the silicon substrate 10 within the first region R1 of the silicon substrate, and in particular formed as the patterned silicon layers 16b and 16c interposed between the first series of comparatively narrowly spaced microelectronic structures 12a, 12b and 12c and upon the comparatively narrow portions of the silicon substrate 10. Within the present invention and the first preferred embodiment of the present invention, the series of patterned silicon layers 16a, 16b, 16c and 16d is formed employing a selective deposition method to form the series of patterned silicon layers 16a, 16b, 16c and 16d of silicon materials including but not limited to amorphous silicon materials, monocrystalline silicon materials and polycrystalline silicon materials. More typically and preferably, the series of patterned silicon layers 16a, 16b, 16c and 16d is formed of a silicon material selected from the group including but not limited to monocrystalline silicon materials and polycrystalline silicon materials which correspond with the monocrystalline silicon materials and polycrystalline silicon materials from which are typically and preferably formed the silicon substrate 10. Typically and preferably, each of the series of patterned silicon layers 16a, 16b, 16c and 16d is formed to a thickness of from about 1,000 to about 5,000 angstroms.

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein, in a first instance, the patterned masking layer 14 has been stripped from the microelectronic fabrication. The patterned masking layer 14 may be stripped from the microelectronic fabrication whose schematic cross-sectional diagram is illustrated in FIG. 2 to provide in part the microelectronic fabrication whose schematic cross-sectional diagram is illustrated in FIG. 3 while employing methods and materials as are conventional in the art of microelectronic fabrication.

There is also shown within the schematic cross-sectional diagram of FIG. 3 a dopant 18 which simultaneously: (1) treats the patterned silicon layers 16a, 16b, 16c and 16d to form a series of doped patterned silicon layers 16a', 16b', 16c' and 16d'; and (2) treats portions of the silicon substrate 10 exposed adjoining the second series of patterned microelectronic structures 12d, 12e and 12f to form a doped silicon substrate 10' having formed therein a series of doped silicon substrate regions 10a', 10b', 10c' and 10d'.

Within the present invention and the preferred embodiment of the present invention, the dopant 18 may be supplied employing methods as are conventional in the art of microelectronic fabrication, including but not limited to thermal diffusion methods and ion implant methods. More preferably, the dopant 18 is provided employing an ion implant method employing an ion implant dose of from about 1.0E13 to about 1.0E16 dopant ions per square centimeter and an ion implant energy of from about 10 to about 100 kev. Similarly, as is also understood by a person skilled in the art, the dopant 18 may be of polarity and chemical composition as are known in the art of microelectronic fabrication and appropriate for the patterned silicon layers 16a, 16b, 16c and 16d and the silicon substrate 10, and in particular may include dopants selected from the group including but not limited to arsenic containing dopants, boron containing dopants and phosphorus containing dopants.

Upon forming the microelectronic fabrication whose schematic cross-sectional diagram is illustrated in FIG. 3, there is formed a microelectronic fabrication having formed therein two series of microelectronic structures which are formed simultaneously employing a self-aligned method. The first series of microelectronic structures is the series of doped patterned silicon layers 16a', 16b', 16c' and 16d', and the second series of microelectronic structures is the series of doped silicon substrate regions 10a', 10b', 10c' and 10d'.

Although, the first preferred embodiment of the present invention illustrates the present invention within the context of masking the second region R2 of the silicon subs rate 10 and selectively depositing the series of patterned silicon layers 16a, 16b, 16c and 16d upon exposed portions of the first region R1 of the silicon substrate, and while such a disposition of masking and selective deposition provides particular advantage within the present invention as will become more clear within the context of the second preferred embodiment of the present invention which follows, the present invention may also be practiced where a series of comparatively narrow portions of a silicon substrate is masked and a series of patterned silicon layers is selectively deposited upon a series of comparatively wide portions of the silicon substrate.

Second Preferred Embodiment

Figure 4:
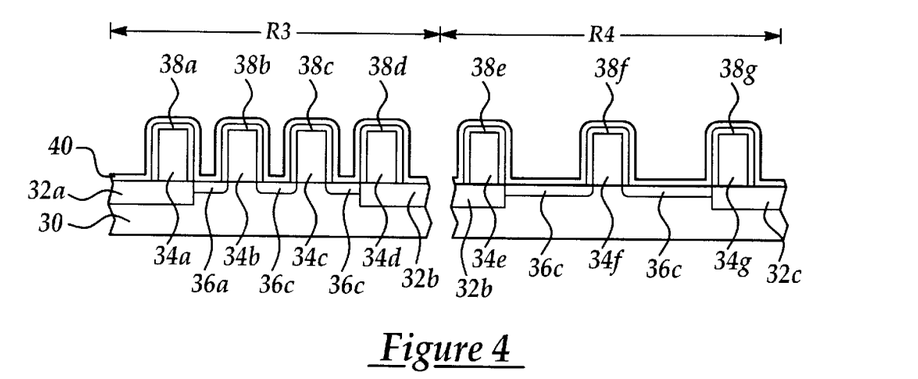
FIG. 4 to FIG. 9 show a series of schematic cross-sectional diagrams illustrating the results of forming, in accord with a more specific embodiment of the present invention which comprises a second preferred embodiment of the present invention, a plurality of series of self-aligned microelectronic structures within a semiconductor integrated circuit microelectronic fabrication.

Referring now to FIG. 4 to FIG. 9, there is show a series of schematic cross-sectional diagrams illustrating the results of forming, in accord with a more specific embodiment of the present invention which comprises a second preferred embodiment of the present invention, a plurality of series of self-aligned microelectronic structures within a semiconductor integrated circuit microelectronic fabrication. Shown within FIG. 4 is a schematic cross-sectional diagram of the semiconductor integrated circuit microelectronic fabrication at an early stage in its fabrication in accord with the second preferred embodiment of the present invention.

Shown in FIG. 4, in a first instance, is a semiconductor substrate 30 having formed within and upon its surface a series of shallow trench isolation regions 32a, 32b and 32c which defines a pair of active regions of the semiconductor substrate 30.

Within the second preferred embodiment of the present invention with respect to the semiconductor substrate 30, although it is known in the art of semiconductor integrated circuit microelectronic fabrication that semiconductor substrates are available with either dopant polarity, various dopant concentrations and several crystallographic orientations, for the second preferred embodiment of the present invention, the semiconductor substrate 30 is typically and preferably a (100) silicon semiconductor substrate having an N- or P-doping.

Similarly within the second preferred embodiment of the present invention with respect to the series of shallow trench isolation regions 32a, 32b and 32c, although it is known in the art of semiconductor integrated circuit microelectronic fabrication that shallow trench isolation regions may be formed employing methods including but not limited to shallow trench isolation region deposition methods and shallow trench isolation region thermal growth methods, for the second preferred embodiment of the present invention the series of shallow trench isolation regions 32a, 32b and 32c is typically and preferably formed at least in part employing a shallow trench isolation region deposition method, to form the series of shallow trench isolation regions 32a, 32b and 32c of silicon oxide formed nominally planar with the active regions of the semiconductor substrate 30.

Also shown within the schematic cross-sectional diagram of FIG. 4 formed upon either the shallow trench isolation regions 32a, 32b and 32c or the active regions of the semiconductor substrate 30 defined by the series of shallow trench isolation regions 32a, 32b and 32c is a series of patterned gate electrode stack layers 34a, 34b, 34c, 34d, 34e, 34f and 34g. Within the second preferred embodiment of the present invention, as illustrated within the schematic cross-sectional diagram of FIG. 4, a first sub-series of patterned gate electrode stack layers 34a, 34b, 34c and 34d is formed within a third region R3 of the semiconductor substrate 30 while a second sub-series of patterned gate electrode stack layers 34e, 34f and 34g is formed within a fourth region R4 of the semiconductor substrate 30, and further wherein the constraints and limitations of the third region R3 of the semiconductor substrate 30 and the fourth region R4 of the semiconductor substrate 30 as illustrated within the schematic cross-sectional diagram of FIG. 4 correspond, respectively, with the constraints and limitations of the first region R1 of the silicon substrate 10 and the second region R2 of the silicon substrate 10 as illustrated within the schematic cross-sectional diagram of FIG. 1. Thus, the first sub-series of patterned gate electrode stack layers 34a, 34b, 34c and 34d (which typically and preferably is employed within a series of structures within a cell array region of a semiconductor integrated circuit microelectronic fabrication) is formed with a narrower spacing than the second sub-series of patterned gate electrode stack layers 34e, 34f and 34g (which typically and preferably is employed within a series of structures with a peripheral region of the semiconductor integrated circuit microelectronic fabrication).

As is understood by a person skilled in the art, the series of patterned gate electrode stack layers 34a, 34b, 34c, 34d, 34e, 34f and 34g will typically and preferably be formed employing gate electrode stack materials as are conventional in the art of semiconductor integrated circuit microelectronic fabrication. For the sub-series of patterned gate electrode stack layers 34b, 34c and 34f, which are formed directly upon an active region of the semiconductor substrate 30, but not for the sub-series of patterned gate electrodes stack layers 34a, 34d, 34e and 34g, which are formed upon the shallow trench isolation regions 32a, 32b and 32c, the patterned gate electrode stack layers typically comprise a patterned gate dielectric layer formed upon the active region of the semiconductor substrate. Typically and preferably, the patterned gate dielectric layer will be formed to a thickness of from about 20 to about 100 angstroms. Similarly, for each of the patterned gate electrode stack layers 34a, 34b, 34c, 34d, 34e, 34f and 34g there will also typically and preferably be employed a doped polysilicon (of dopant concentration greater than about 1E18 per cubic centimeter) or polycide (doped polysilicon/metal silicide stack) gate electrode layer typically and preferably formed to a thickness of from about 2,000 to about 6,000 angstroms and linewidth of from about 0.1 to about 0.5 microns, optionally having formed and aligned thereupon a patterned hard mask layer, typically and preferably of thickness from about 1,000 to about 2,000 angstroms.

There is also shown within the schematic cross-sectional diagram of FIG. 4 formed within the active regions of the semiconductor substrate 30 at areas not covered by the sub-series of patterned gate electrode stack layers 34b, 34c and 34f a series of lightly doped drain low dose ion implant regions 36a, 36b, 36c, 36d and 36e. The series of light doped drain low dose ion implant regions 36a, 36b, 36c, 36d and 36e is typically and preferably formed employing an ion implant method, while employing an appropriate implanting ion and the series of patterned gate electrode stack layers 34a, 34b, 34c, 34d, 34e, 34f and 34g as a mask, at an ion implant dose of from about 1E13 to about 1E16 dopant ions per square centimeter and an ion implant energy of from about 10 to about 100 kev.

There is also shown within the schematic cross-sectional diagram of FIG. 1 a series of patterned etch stop dielectric layers 38a, 38b, 38c, 38d, 38e, 38f and 38g formed nominally conformally encapsulating each of the patterned gate electrode stack layers 34a, 34b, 34c, 34d, 31e, 34f and 34g to provide therefrom a series of insulated gate electrode structures, but covering neither portions of the active regions of the semiconductor substrate 30 nor the series of shallow trench isolation regions 32a, 32b and 32c exposed interposed between the series of patterned gate electrode stack layers 34a, 34b, 34c, 34d, 34e, 34f and 34g. As is understood by a person skilled in the art, the series of patterned etch stop dielectric layers 38a, 38b, 38c, 38d, 38e, 38f and 38g is typically and preferably comprises: (1) a corresponding series of patterned planar etch stop dielectric layers nominally aligned with the series of patterned gate electrode stack layers 34a, 34b, 34c, 34d, 34e, 34f and 34g; and (2) a corresponding series of patterned etch stop dielectric spacer layers formed adjoining the sides of each of the series of patterned gate electrode stack layers 34a, 34b, 34c, 34d, 34e, 34f and 34g.

As is understood by a person skilled in the art, although the patterned etch stop dielectric layers 38a, 38b, 38c, 38d, 38e, 38f and 38g may be formed of dielectric materials as are conventional in the art of microelectronic fabrication, including but not limited to silicon oxide dielectric materials, silicon nitride dielectric materials and silicon oxynitride dielectric materials, insofar as the patterned etch stop dielectric layers are intended to function as an etch stop with respect to an additional dielectric layer formed thereupon, and silicon oxide dielectric materials are most common within the art of microelectronic fabrication, the patterned etch stop dielectric layers 38a, 38b, 38c, 38d, 38e, 38f and 38g will typically and preferably be formed of a silicon nitride dielectric material or a silicon oxynitride dielectric material. Typically and preferably, each of the series of patterned etch stop dielectric layers 38a, 38b, 38c, 38d, 38e, 38f and 38g is formed to a thickness of from about 200 to about 1,500 angstroms fully encapsulating exposed portions of the patterned gate electrode stack layers 34a, 34b, 34c, 34d, 34e, 34f and 34g to provide the series of insulated gate electrode structures of thickness about 2,000 to about 8,000 angstroms each.

Finally, there is shown within the schematic cross-sectional diagram of FIG. 4 formed covering the series of patterned etch stop dielectric layers 38a, 38b, 38c, 38d, 38e, 38f and 38g, as well as exposed portions of the active regions of the semiconductor substrate 30 and the shallow trench isolation regions 32a, 32b and 32c, a blanket conformal sacrificial passivation layer 40. The blanket conformal sacrificial passivation layer 40 is intended to passivate portions of the active regions of the semiconductor substrate 30 with respect to selective patterned silicon layer growth. Although, the blanket conformal sacrificial passivation layer 40 may be formed from any of several materials which realize the foregoing object, from a practical perspective, the blanket conformal sacrificial passivation layer 40 is typically and preferably formed of a silicon oxide dielectric material deposited employing a chemical vapor deposition (CVD) method. Typically and preferably, the blanket conformal sacrificial passivation layer 40 is formed to a thickness of from about 100 to about 500 angstroms.

Figure 5:
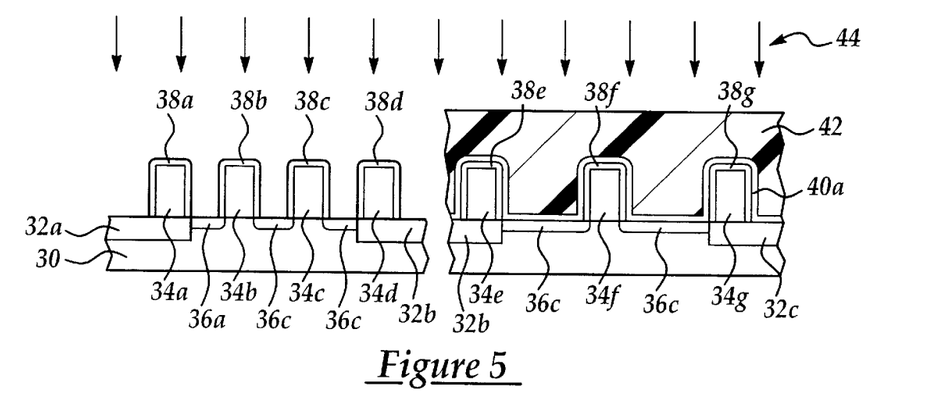

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein, in a first instance, there is formed upon the blanket conformal sacrificial passivation layer 40 a patterned first photoersist layer 42, which in turn covers the blanket conformal sacrificial passivation layer 40 at the location of the fourth region R4 of the semiconductor substrate 30 having formed thereupon the second sub-series of patterned gate electrode stack layers 34e, 34f and 34g of comparatively wide spacing. The patterned first photoresist layer 42 may be formed employing methods and materials, and in particular photoresist materials, as are conventional in the art of microelectronic fabrication, including but not limited to photoresist materials selected from the group including but not limited to positive photoresist materials and negative photoresist materials. Typically and preferably, the patterned photoresist layer 42 is formed to a thickness of from about 3,500 to about 10,000 angstroms.

Similarly, there is also shown within the schematic cross-sectional diagram of FIG. 5 a first etchant 44 which is employed for etching the blanket conformal sacrificial passivation layer 40 to form a patterned conformal sacrificial passivation layer 40a covering only the fourth region R4 of the semiconductor substrate 30. Under circumstances within the second preferred embodiment of the present invention where the blanket conformal sacrificial passivation layer 40 is formed of a silicon oxide dielectric material, the first etchant 44 may be selected from the group of etchants including but not limited to fluoride containing (i.e., hydrofluoric acid containing) wet etchants and silicon oxide specific fluorine containing (i.e., fluorocarbon containing) dry plasma etchants, with silicon oxide specific fluorine containing dry plasma etchants being typical and preferred.

Figure 6:
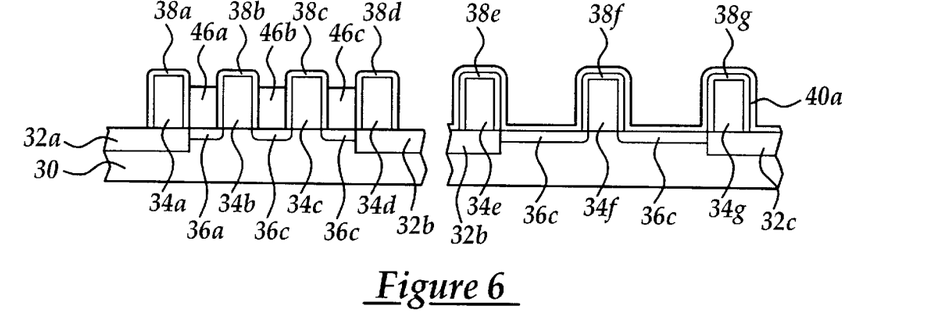

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein, in a first instance, the patterned first photoresist layer 42 has been stripped from the semiconductor integrated circuit microelectronic fabrication. The patterned first photoresist layer 42 may be stripped from the semiconductor integrated circuit microelectronic fabrication whose schematic cross-sectional diagram is illustrated in FIG. 5 to provide in part the semiconductor integrated circuit microelectronic fabrication whose schematic cross-sectional diagram is illustrated in FIG. 6 while employing photoresist stripping methods and materials as are conventional in the art of semiconductor integrated circuit microelectronic fabrication, such photoresist stripping methods and materials including but not limited to dry plasma photoresist stripping methods and materials and wet chemical photoresist stripping methods and materials.

Also shown within the schematic cross-sectional diagram of FIG. 6 is a series of patterned silicon layers 46a, 46b and 46c formed selectively interposed between the series of patterned etch stop insulator layers 36a, 36b, 36c and 36d which encapsulate otherwise exposed surfaces of the first sub-series of patterned gate electrode stack layers 34a, 34b, 34c and 34d. The series of patterned silicon layers 46a, 46b and 46c may be formed employing methods as are conventional in the art of semiconductor integrated circuit microelectronic fabrication, and will typically include but are not limited to selective epitaxial deposition methods and selective chemical vapor deposition (CVD) methods to provide the patterned silicon layers 46a, 46b and 46c formed of a corresponding silicon material selected from the group consisting of a monocrystalline silicon material and a polycrystalline silicon material. Such selective deposition methods are generally known in the art of microelectronic fabrication, and are disclosed, for example and without limitation, within Murali et al, U.S. Pat. No. 4,966,868, as cited within the Description of the Related Art, all of which related art is incorporated herein fully by reference. Typically and preferably, the series of patterned silicon layers 46a, 46b and 46c is formed to a thickness of from about 1,000 to about 5,000 angstroms and may be doped if formed as a polysilicon material while employing a chemical vapor deposition (CVD) method.

Figure 7:
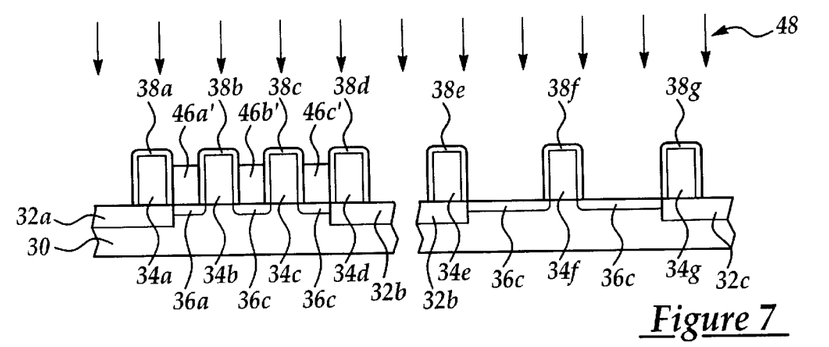

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein, in a first instance, the patterned conformal sacrificial passivation layer 40a has been stripped from the semiconductor integrated circuit microelectronic fabrication.

The patterned conformal sacrificial passivation layer 40a may be stripped from the semiconductor integrated circuit microelectronic fabrication whose schematic cross-sectional diagram is illustrated in FIG. 6 to provide in part the semiconductor integrated circuit microelectronic fabrication whose schematic cross-sectional diagram is illustrated in FIG. 7 while employing stripping methods and materials as are conventional in the art of semiconductor integrated circuit microelectronic fabrication. Such stripping methods and materials will typically and preferably employing methods and materials analogous or equivalent to the methods and materials as are employed for forming the blanket conformal sacrificial passivation layer 40 as illustrated within the schematic cross-sectional diagram of FIG. 4 the patterned conformal sacrificial passivation layer 40a as illustrated within the schematic cross-sectional diagram of FIG. 5.

There is also shown within the schematic cross-sectional diagram of FIG. 7 a dopant 48 which is employed for: (1) forming from the patterned silicon layers 46a, 46b, 46c as illustrated within the schematic cross-sectional diagram of FIG. 6 a series of doped patterned silicon layers 46a', 46b' and 46c' as illustrated in FIG. 7, as well as; (2) forming from the pair of lightly doped drain low dose ion implant regions 36d and 36e as illustrated within the schematic cross-sectional diagram of FIG. 6 a pair of source/drain regions 50a and 50b having incorporated therein the pair of lightly doped drain low dose ion implant regions 36d and 36e as illustrated in FIG. 7.

As is understood by a person skilled in the art, the dopant 48 as illustrated within the schematic cross-sectional diagram of FIG. 7 within the second preferred embodiment of the present invention is provided employing methods, materials and process conditions analogous or equivalent to the methods, materials and process conditions employed for providing the dopant 18 within the first preferred embodiment of the present invention as illustrated within the schematic cross-sectional diagram of FIG. 3.

Figure 8:
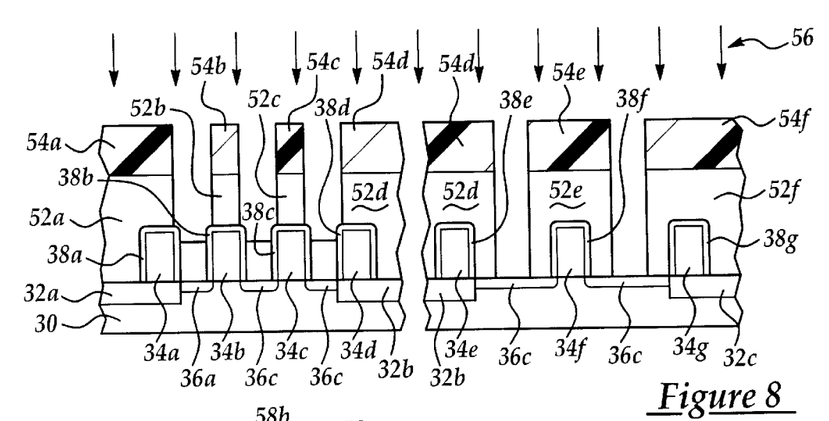

Referring now to FIG. 8, there is shown a schematic cross-sectional diagram illustrating the results of further processing of the semiconductor integrated circuit microelectronic fabrication whose schematic cross-sectional diagram is illustrated in FIG. 7.

Shown in FIG. 8 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 7, but wherein there is sequentially: (1) formed upon the semiconductor integrated circuit microelectronic fabrication a blanket planarized pre-metal dielectric layer; (2) formed upon the blanket planarized pre-metal dielectric layer a series of patterned second photoresist layers 54a, 54b, 54c, 54d, 54e and 54f; and (3) etched the blanket planarized pre-metal dielectric layer to form a series of patterned planarized pre-metal dielectric layers 52a, 52b, 52c, 52d, 52e and 52f while employing the series of patterned photoresist layers 54a, 54b, 54c, 54d, 54e and 54f as a series of etch mask layers, in turn while employing a second etchant 56.

Within the second preferred embodiment of the present invention, the blanket planarized pre-metal dielectric layer may be formed employing methods and materials analogous or equivalent to the methods and materials employed for forming the blanket conformal sacrificial passivation layer 40 as illustrated within the schematic cross-sectional diagram of FIG. 4, but generally formed to a substantially greater planarized thickness of from about 6,000 to about 12,000 angstroms. Similarly, within the second preferred embodiment of the present invention, each of the series of patterned second photoresist layers 54a, 54b, 54c, 54d, 54e and 54f is formed employing methods, materials and thickness dimensions analogous or equivalent to the methods, materials and thickness dimensions employed for forming the patterned first photoresist layer 42 as illustrated within the schematic cross-sectional diagram of FIG. 2. Finally, within the second preferred embodiment of the present invention, the second etchant 56 is typically and preferably provided employing an etchant analogous or equivalent to the first etchant 44 as illustrated within the schematic cross-sectional diagram of FIG. 5.

As is understood by a person skilled in the art, within the semiconductor integrated circuit microelectronic fabrication whose schematic cross-sectional diagram is illustrated in FIG. 8, a first series of contact vias reaching the series of doped patterned silicon layers 46a', 46b' and 46c' is formed in part in a self-aligned fashion due to the presence of the series of patterned etch stop dielectric layers 38a, 38b, 38c and 38d when etching the blanket planarized pre-metal dielectric (PMD) layer to form the series of patterned planarized pre-metal dielectric layers 52a, 52b, 52c, 52d, 52e and 52f. In contrast, within the semiconductor integrated circuit microelectronic fabrication whose schematic cross-sectional diagram is illustrated in FIG. 8, a second pair of contact vias which reaches the pair of source/drain regions 50a and 50b is not formed in a self aligned fashion. Finally, as is also understood by a person skilled in the art, the series of doped patterned silicon layers 46a', 46b' and 46c' as illustrated within the schematic cross-sectional diagram of FIG. 8 provide particular value within the context of the second preferred embodiment of the present invention insofar as the series of doped patterned polysilicon layers 46a', 46b' and 46c' mitigates a need for over-etching to fully clear a series of otherwise narrow aperture width contact vias which access the series of lightly doped drain low dose ion implant regions 36a, 36b and 36c. Similarly, under such circumstances, the series of doped patterned silicon layers 46a', 46b' and 46c' serves as a series of elevated source/drain regions within a series of adjoining field effect transistors (FETs) whose gate electrodes comprise the pair of patterned gate electrode stack layers 34b and 34c.

Figure 9:
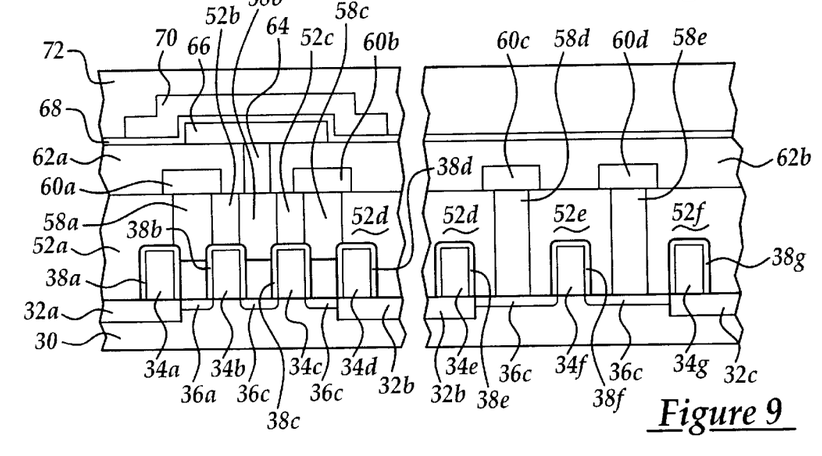

Referring now to FIG. 9, there is shown a schematic cross-sectional diagram illustrating the results of further processing of the semiconductor integrated circuit microelectronic fabrication whose schematic cross-sectional diagram is illustrated in FIG. 8.

Shown in FIG. 9 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 8, but wherein in a first instance, there is formed into the series of contact vias which accesses the series of doped patterned silicon layers 46a', 46b' and 46c' and the pair of contact vias which accesses the pair of source/drain regions 50a and 50b a series of conductor contact studs 58a, 58b, 58c, 58d and 58e. The series of conductor contact studs 58a, 58b, 58c, 58d and 58e may be formed employing methods and materials as are conventional in the art of microelectronic fabrication, including but not limited to selective deposition methods as well as blanket deposition and planarization methods, to provide the series of conductor contact studs 58a, 58b, 58c, 58d and 58e at least in part of conductor materials including but not limited to doped polysilicon conductor materials and tungsten conductor materials. Typically and preferably, the series of conductor contact studs 58a, 58b, 58c, 58d and 58e is formed of a thickness sufficient to reach the upper surfaces of the series of patterned planarized pre-metal dielectric layers 52a, 52b, 52c, 52d, 52e and 52f.

There is also shown within the schematic cross-sectional diagram of FIG. 1: (1) a series of patterned first conductor layers 60a, 60b, 60c and 60d formed contacting the conductor contact studs 58a, 58c, 58d and 58e; (2) a pair of patterned planarized inter-metal dielectric (IMD) layers 62a and 62b formed passivating the series of patterned first conductor layers 60a, 60b, 60c and 60d and exposed surfaces of the patterned planarized pre-metal dielectric layers 52a, 52b, 52c, 52d, 52e and 52f; (3) a conductor interconnect stud 64 contacting the conductor contact stud 58b; (4) a first capacitor plate layer 66 contacting the conductor interconnect stud 64 and bridging over the pair of patterned first inter-metal dielectric (IMD) layers 62a and 62b; (5) a blanket capacitor dielectric layer 68 passivating the patterned first capacitor plate 66; (6) a patterned second capacitor plate 70 separated from the patterned first capacitor plate 66 by the blanket capacitor dielectric layer 68; and (7) a blanket second inter-metal dielectric (IMD) layer 72 passivating the entire semiconductor integrated circuit microelectronic fabrication.

Each of the foregoing layers and structures may be formed employing methods and materials as are otherwise conventional in the art of semiconductor integrated circuit microelectronic fabrication.

For example, the series of patterned first conductor layers 60a, 60b, 60c and 60d may be formed of conductor materials including but not limited to metal, metal alloy, doped polysilicon and polycide conductor materials, typically and preferably formed to a thickness of from about 3,000 to about 8,000 angstroms. In addition, the pair of patterned first inter-metal dielectric (IMD) layers 62a and 62b may be formed to a thickness of from about 4,000 to about 8,000 angstroms of a dielectric material analogous or equivalent to the dielectric material from which is formed the series of patterned planarized pre-metal dielectric layers 52a, 52b, 52c, 52d, 52e and 52f. Further, the conductor interconnect stud 64 may be formed employing methods and materials analogous or equivalent to the methods and materials employed for forming the series of conductor contact studs 58a, 58b, 58c, 58d and 58e. Still further, the patterned first capacitor plate 66 and the patterned second capacitor plate 70 may be formed of doped polysilicon materials, each formed to a thickness of from about 1,000 to about 3,500 angstroms, and often alternatively fabricated with intricate geometric shapes in order to increase areal capacitance. Still yet further, the blanket capacitor dielectric layer 68 may be formed to a thickness of from about 30 to about 200 angstroms while typically and preferably employing a composite silicon oxide/silicon nitride/silicon oxide capacitor dielectric material. Finally, the blanket second inter-metal dielectric layer 72 may be formed to a thickness of from about 6,000 to about 12,000 angstroms from a dielectric material analogous or equivalent to the dielectric material from which is formed the pair of patterned planarized first inter-metal dielectric layers 62a and 62b.

Upon forming the semiconductor integrated circuit microelectronic fabrication whose schematic cross-sectional diagram is illustrated in FIG. 9, there is formed in accord with a second preferred embodiment of the present invention a semiconductor integrated circuit microelectronic fabrication having formed therein a multiplicity of series of microelectronic structures formed simultaneously while employing a self-aligned method. The multiplicity of series of microelectronic structures includes: (1) a series of doped patterned silicon layers 46a', 46b' and 46c' which serve as a series of elevated source/drain electrodes within a pair of closely spaced field effect transistors (FETs) within a cell region of the semiconductor integrated circuit microelectronic fabrication; and (2) a pair of non-elevated source/drain regions 50a and 50b within a field effect transistor (FET) within a more widely spaced peripheral area of the semiconductor integrated circuit microelectronic fabrication.

As is understood by a person skilled in the art, the preferred embodiments of the present invention are illustrative of the present invention rather than limiting of the present invention. Revisions and modifications may be made to methods, materials, structures and dimensions employed for forming a microelectronic fabrication, or a semiconductor integrated circuit microelectronic fabrication, in accord with the preferred embodiment of the present invention, while still forming a microelectronic fabrication, or a semiconductor integrated circuit microelectronic fabrication, in accord with the present invention, further in accord with the accompanying claims.

What is claimed is:

1. A method for fabricating a mircoelectronic device comprising:

providing a silicon substrate;

forming upon the silicon substrate a first series of structures having a first spacing which leaves exposed a first series of portions of the silicon substrate, the first series of structures being separated from a second series of structures also formed upon the silicon substrate, the second series of structures having a second spacing which leaves exposed a second series of comparatively wide portions of the silicon substrate;

wherein the second spacing is wider than the first spacing;

masking one of the first series of portions of the silicon substrate and the second series of portions of the silicon substrate using a mask;

forming selectively upon the other of the first series of portions of the silicon substrate and the second series of portions of the silicon substrate a series of patterned silicon layers removing the mask;

doping simultaneously the series of patterned silicon layers and the one of the first series of portions of the silicon substrate and the second series of portions of the silicon substrate which was masked.

2. The method of claim 1 wherein the silicon substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the silicon substrate is formed from a silicon material selected from the group consisting of amorphous silicon material, monocrystalline silicon material and polycrystalline silicon materials.

4. The method of claim 1 wherein the first series of structures and the second series of structures are formed to a thickness of from about 2,000 to about 6,000 angstroms.

5. The method of claim 1 wherein:

the spacing is from about 0.1 to about 0.5 microns; and the spacing is from about 0.1 to about 0.5 microns.

6. The method of claim 1 wherein the series of portions of the silicon substrate is masked.

7. The method of claim 1 wherein the series of portions of the silicon substrate is masked.

8. The method of claim 1 wherein the series of patterned silicon layers is formed to a thickness of from about 1,000 to about 5,000 angstroms.

9. The method of claim 1 wherein the simultaneous doping is undertaken employing methods selected from the group consisting of thermal diffusion methods and ion implantation methods.

10. A method for fabricating a semiconductor integrated circuit microelectronic device comprising:

providing a silicon semiconductor substrate;

forming upon the silicon semiconductor substrate a first series of insulated gate electrode structures having a first spacing which leaves exposed a first series of portions of the silicon semiconductor substrate, the first series of insulated gate electrode structures being separated from a second series of insulated gate electrode structures also formed upon the silicon semiconductor substrate, the second series of insulated gate electrode structures having a second spacing which leaves exposed a second series of portions of the silicon semiconductor substrate;

wherein the second spacing is wider than the first spacing;

masking the second series of portions of the silicon semiconductor substrate using a mask;

forming selectively upon the first series of portions of the silicon semiconductor substrate and interposed between the first series of insulated gate electrode structures a series of patterned silicon layers removing the mask;

doping simultaneously the series of patterned silicon layers to form a series of doped patterned silicon layers and the second series of portions of the silicon semiconductor substrate to form a series of doped silicon semiconductor substrate regions.

11. The method of claim 10 wherein the first series of insulated gate electrode structures and the second series of insulated gate electrode structures are formed to a thickness of from about 2,000 to about 6,000 angstroms.

12. The method of claim 10 wherein:

the spacing is from about 0.1 to about 0.5 microns; and the spacing is from about 0.1 to about 0.5 microns.

13. The method of claim 10 wherein the series of patterned silicon layers is formed to a thickness of from about 1,000 to about 5,000 angstroms.

14. The method of claim 10 wherein the simultaneous doping is undertaken employing methods selected from the group consisting of thermal diffusion methods and ion implantation methods.

15. The method of claim 10 wherein the doped patterned silicon layers are employed as a series of elevated source/drain electrodes of a series of field effect transistors (FETs) within a cell region of the semiconductor integrated circuit microelectronic device and the doped silicon semiconductor substrate regions are employed as a series of source/drain regions of a series of field effect transistors (FETs) within a peripheral region of the semiconductor integrated circuit microelectronic device.

* * * * *